United States Patent
Mori et al.

(10) Patent No.: US 8,426,504 B2
(45) Date of Patent: *Apr. 23, 2013

(54) HARDENABLE EPOXY RESIN COMPOSITION

(75) Inventors: Takahiro Mori, Tokyo (JP); Setsuko Hirakawa, Tokyo (JP); Yoshihiro Fukuda, Tokyo (JP); Seiichi Saito, Tokyo (JP); Yoshinori Takahata, Tokyo (JP); Mitsunori Ide, Tokyo (JP)

(73) Assignee: Adeka Corporation, Tokyo (JP)

( * ) Notice: Subject to any disclaimer, the term of this patent is extended or adjusted under 35 U.S.C. 154(b) by 1177 days.

This patent is subject to a terminal disclaimer.

(21) Appl. No.: 11/916,105

(22) PCT Filed: May 17, 2006

(86) PCT No.: PCT/JP2006/309793
§ 371 (c)(1),
(2), (4) Date: Nov. 30, 2007

(87) PCT Pub. No.: WO2006/129480
PCT Pub. Date: Dec. 7, 2006

(65) Prior Publication Data
US 2010/0190899 A1    Jul. 29, 2010

(30) Foreign Application Priority Data

May 31, 2005 (JP) .................................. 2005-158535
Mar. 15, 2006 (JP) .................................. 2006-071416

(51) Int. Cl.
*C08K 5/49* (2006.01)
(52) U.S. Cl.
USPC ............ 524/121; 525/423; 524/538; 524/493
(58) Field of Classification Search .................... 524/121
See application file for complete search history.

(56) References Cited

U.S. PATENT DOCUMENTS 2,915,484 A    12/1959   Kohler et al.
5,130,481 A *  7/1992   Khanna et al. ................. 564/157

FOREIGN PATENT DOCUMENTS

| DE | 1099733 | | 2/1961 |
|---|---|---|---|
| JP | 07-122684 | * | 5/1995 |
| JP | 08-151505 | A | 6/1996 |
| JP | 9-176485 | A | 7/1997 |
| JP | 11-199555 | A | 7/1999 |
| JP | 11-199653 | A | 7/1999 |
| JP | 11-302401 | A | 11/1999 |
| JP | 2001-31784 | | 2/2001 |
| JP | 2001-49082 | | 2/2001 |
| JP | 2001146546 | | 5/2001 |
| JP | 2001-354836 | * | 12/2001 |
| JP | 2002-145994 | A | 5/2002 |
| JP | 2003-082061 | A | 3/2003 |
| JP | 2004-269641 | A | 9/2004 |
| JP | 2005-29720 | * | 2/2005 |

OTHER PUBLICATIONS

Machine tranlation of JP 2005-29720, JP 2001-354836 and JP 07-122684.*
Chinese Patent Office issued a Chinese Office Action dated Mar. 10, 2010, Application No. 200680019173.1.
International Search Report of PCT/JP2006/309793, filed May 17, 2006, date of mailing Jul. 18, 2006.
Notice of Preliminary Rejection mailed Sep. 21, 2012 by the Korean Intellectual Property Office in counterpart Korean Application No. 10-2007-7030472 with partial English translation, 6 pages.
Notice of Rejection dated Apr. 17, 2012, with English Translation, Application No. 2007-518902.
Taiwan Official Action—095119286—Jul. 23, 2012.

* cited by examiner

*Primary Examiner* — Doris Lee
(74) *Attorney, Agent, or Firm* — Young & Thompson

(57) ABSTRACT

The epoxy resin composition of the present invention is characterized in that a polyamide compound having a moiety derived from a hydroxyl substituted aromatic amine having a phenolic hydroxyl group adjacent to an amino group is used as an epoxy resin hardener.

19 Claims, No Drawings

HARDENABLE EPOXY RESIN COMPOSITION

TECHNICAL FIELD

The present invention relates to a hardenable epoxy resin composition that contains a polyamide compound having a phenolic hydroxyl group at a specific position in the molecular structure thereof, more specifically, to a hardenable epoxy resin composition that provides a hardened material having a small linear expansion coefficient and an excellent tensile strength by containing the foregoing polyamide compound as a hardener.

BACKGROUND ART

An epoxy resin has been widely used for printing circuit boards due to its properties. The epoxy resin has also been investigated to comply with high density requirements associated with the recent development in reduction in size and weight.

In particular, as is found in a build-up circuit board, a plating resist that remains as an insulating layer in a printing circuit board is required to have high glass transition temperature, volumetric specific resistance, mechanical properties, and low water absorption capable of coping with heat generation from wirings highly integrated, thinning of insulating layers, and lowering in adhesion between conductive layers and insulating layers.

Further, the epoxy resin that is used for prepregs or the like is conventionally admixed with various kinds of inorganic fillers so as to reduce linear expansion and to prevent thermal deformation. However, it is difficult to admix inorganic fillers, since the inorganic fillers admixed with the epoxy resin sometimes lower the tensile strength or elongation, or impair the reliability of the circuitries by short-circuit caused by aggregation.

In relation to the epoxy resin, a hardened material prepared from 2,2-bis(3,4-epoxycyclohexyl)propane and an acid anhydride is disclosed in Patent Document 1. Further, Patent Documents 2, 3, and 4 disclose an epoxy resin that is admixed with a polyamide having a phenolic hydroxyl group.

The epoxy resin disclosed in Patent Documents 2 and 3 is the one that is separately admixed with a hardener. The polyamide having a phenolic hydroxyl group disclosed in Patent Document 4 has a molecular structure that is derived from an aromatic dicarboxylic acid having a hydroxyl group as a source material. There is no specific description about the compound of the present invention that is obtained with using an aromatic diamine having a hydroxyl group as a source material. There is also no description about a specific effect on the linear expansion coefficient.

Patent Document 1: DE 107,798
Patent Document 2: Claims, and Examples described from page 6, line 40 on the left column to the end of page 8 of Japanese Patent Laid-Open Publication No. 2001-31784
Patent Document 3: Claims of Japanese Patent Laid-Open Publication No. 2001-49082
Patent Document 4: Claims of Japanese Patent Laid-Open Publication No. 2005-29720

DISCLOSURE OF THE INVENTION

Problems to be Solved by the Invention

Therefore, it is an object of the present invention to provide a hardenable epoxy resin composition that provides a hardened material having high glass transition temperature, low linear expansion coefficient, and excellent properties including tensile strength, elongation, and flexibility.

Means for Solving the Problems

In view of the above circumstances, the present inventors have made intensive studies and found that a hardenable epoxy resin composition, which provides a hardened material having high glass transition temperature, low linear expansion coefficient, and excellent properties including tensile strength, elongation and flexibility, can be obtained with using a polyamide compound as an epoxy resin hardener, wherein the polyamide compound has a moiety that is derived from a hydroxyl-substituted aromatic amine having a phenolic hydroxyl group at the position adjacent to an amino group. The present invention has been accomplished based on this finding.

Namely, the present invention provides a hardenable epoxy resin composition that contains a polyamide compound having as a repeating unit thereof a moiety that has a phenolic hydroxyl group and is represented by the following general formula (I) or general formula (II).

[Chemical 1]

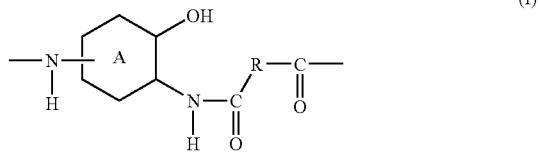

(In the general formula (I), ring-A represents a $C_{6-18}$ arylene group or $C_{13-25}$ alkylidene diarylene group, wherein these groups may be substituted by a halogen atom, a hydroxyl group, or a $C_{1-4}$ alkyl group; R represents a $C_{2-10}$ alkylene group, a $C_{6-18}$ cycloalkylene group, an arylene group, or a $C_{13-25}$ alkylidene diarylene group, wherein these groups may be substituted by a halogen atom, a hydroxyl group, or a $C_{1-4}$ alkyl group; and part of the phenolic hydroxyl groups in the repeating units may undergo cyclodehydration with an amide group adjacent to each phenolic hydroxyl group.)

[Chemical 2]

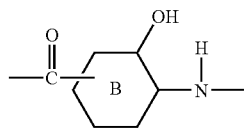

(In the general formula (II), ring-B represents a $C_{6-18}$ arylene group or a $C_{13-25}$ alkylidene diarylene group, wherein these groups may be substituted by a halogen atom, a hydroxyl group, or a $C_{1-4}$ alkyl group.)

Further, the present invention provides the hardenable epoxy resin composition, in which the polyamide compound has the chemical structure that has a phenolic hydroxyl group and is represented by the following general formula (III) or general formula (IV).

[Chemical 3]

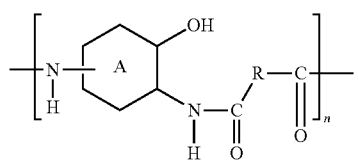
(III)

(In the general formula (III), ring-A represents a $C_{6-18}$ arylene group or a $C_{13-25}$ alkylidene diarylene group, wherein these groups may be substituted by a halogen atom, a hydroxyl group, or a $C_{1-4}$ alkyl group; and R represents a $C_{2-10}$ alkylene group, a $C_{6-18}$ cycloalkylene group, an arylene group, or a $C_{13-25}$ alkylidene diarylene group, wherein these groups may be substituted by a halogen atom, a hydroxyl group, or a $C_{1-4}$ alkyl group; and n is a positive number.)

[Chemical 4]

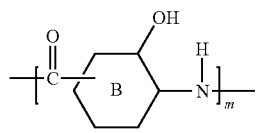
(IV)

(In the general formula (IV), ring-B represents a $C_{6-18}$ arylene group or a $C_{13-25}$ alkylidene diarylene group, wherein these groups may be substituted by a halogen atom, a hydroxyl group, or a $C_{1-4}$ alkyl group; and m is a positive number.)

Still further, the present invention provides the hardenable epoxy resin composition, in which the ring-A in the general formula (I) or general formula (III) is a phenylene group or a naphthylene group.

Still further, the present invention provides the hardenable epoxy resin composition, in which R in the general formula (I) or general formula (III) is phenylene group or naphthylene group.

Still further, the present invention provides the hardenable epoxy resin composition, in which the polyamide compound is a hardener for the epoxy resin composition.

Still further, the present invention provides the hardenable epoxy resin composition, further containing a filler.

Still further, the present invention provides the hardenable epoxy resin composition, in which the filler is spherical silica having an average particle diameter of from 0.1 μm to 20 μm.

Still further, the present invention provides the hardenable epoxy resin composition, further containing a phenolnovolak resin.

Still further, the present invention provides a hardenable epoxy resin composition, in which a phosphorus-based flame retardant is admixed with the aforementioned hardenable epoxy resin composition in an amount of from 5 to 100 parts by mass based on 100 parts by mass of the total amount of epoxy resin and hardener.

Still further, the present invention provides the hardenable epoxy resin composition, in which the phosphorous-based flame retardant is a phosphoric acid amide compound represented by the following general formula (V).

[Chemical 5]

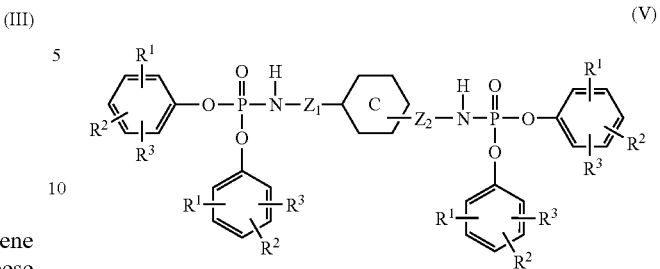
(V)

(In the general formula (V), $R^1$, $R^2$ and $R^3$ each represents a hydrogen atom, a $C_{1-8}$ alkyl, a cycloalkyl group, or a halogen atom; $Z_1$ and $Z_2$ each represents a direct bonding, a $C_{1-4}$ alkylene group, or a alkylidene group; and ring-C represents a $C_{6-18}$ arylene group, a cycloalkylene group, or an arylene-alkylene(alkylidene)-arylene group.)

Still further, the present invention provides a hardened material of the hardenable epoxy resin composition.

Still further, the present invention provides an epoxy resin laminated sheet using the hardenable epoxy resin composition.

BEST MODE FOR CARRYING OUT THE INVENTION

Hereinafter, the present invention will be explained in detail.

The polyamide compound used in the present invention has a moiety represented by the general formula (I) or general formula (II) as a repeating unit thereof, and is characterized by having a phenolic hydroxyl group in the moiety.

[Chemical 6]

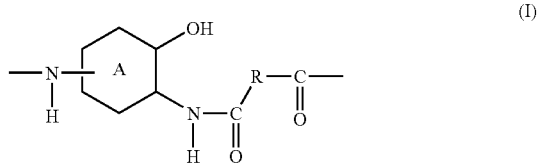
(I)

(In the general formula (I), ring-A represents a $C_{6-18}$ arylene group or $C_{13-25}$ alkylidene diarylene group, wherein these groups may be substituted by a halogen atom, a hydroxyl group, or a $C_{1-4}$ alkyl group; R represents a $C_{2-10}$ alkylene group, a $C_{6-18}$ cycloalkylene group, an arylene group, or a $C_{13-25}$ alkylidene diarylene group, wherein these groups may be substituted by a halogen atom, a hydroxyl group, or a $C_{1-4}$ alkyl group; and part of the phenolic hydroxyl groups in the repeating units may undergo cyclodehydration with an amide group adjacent to each phenolic hydroxyl group.)

[Chemical 7]

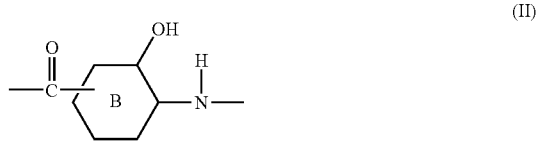
(II)

(In the general formula (II), ring-B represents a $C_{6-18}$ arylene group or a $C_{13-25}$ alkylidene diarylene group, wherein these groups may be substituted by a halogen atom, a hydroxyl group, or a $C_{1-4}$ alkyl group.)

The $C_{6-18}$ arylene group represented by the ring-A in the general formula (I) or the ring-B in the general formula (II) may include 1,2-phenylene, 1,3-phenylene, 1,4-phenylene, 1,5-naphthylene, 2,5-naphthylene, anthrathene-diyl, 4,4'-biphenylene, 4,4'-p-terphenylene, 4,4'-m-terphenylene, 2-fluoro-1,4-phenylene, and 2,5-dimethyl-1,4-phenylene.

The $C_{13-25}$ alkylydene diarylene group represented by the ring-A in the general formula (I) or the ring-B in the general formula (II) may include methylidene diphenylene, ethylidene diphenylene, propylidene diphenylene, isopropylidene diphenylene, hexafluoroisopropylidene diphenylene, propylidene-3,3',5,5'-tetrafluorodiphenylene, and fluorene-9-ylidene diphenylene.

The $C_{2-10}$ alkylene group represented by R in the general formula (I) may include ethylene, propylene, trimethylene, tetramethylene, 2,2-dimethyltrimethylene, hexamethylene, octamethylene, and decamethylene.

The $C_{6-18}$ cycloalkylene group represented by R in the general formula (I) may include a divalent group such as cyclohexane, cycloheptane, cyclooctane, bicyclohexane, and dicyclohexane.

The arylene group represented by R in the general formula (I) may include the same groups as represented by the ring-A mentioned above.

The alkylidene diarylene group represented by R in the general formula (I) may include the same groups as represented by the ring-A mentioned above.

The polyamide compound used in the present invention may contain a moiety represented by the general formula (I) below, which is formed by cyclodehydration between the phenolic hydroxyl group and the amide group adjacent to the phenolic hydroxyl group, as the moiety represented by the general formula (I).

[Chemical 8]

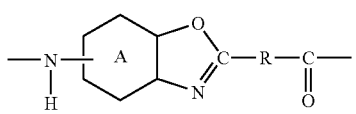

(VI)

(In the formula, the ring-A and R are the same as in the general formula (VI).)

From the viewpoint of the properties of a hardened material (that is, high glass transition temperature, low linear expansion coefficient, tensile strength, elongation, and flexibility), a polyamide compound having a chemical structure that contains only the moieties represented by the general formula (I) or (II) as the repeating unit thereof, namely, a polyamide compound having a chemical structure represented by the general formula (III) or (IV) is preferable in the present invention.

[Chemical 9]

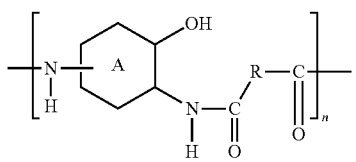

(III)

(In the general formula (III), ring-A represents a $C_{6-18}$ arylene group or a $C_{13-25}$ alkylidene diarylene group, wherein these groups may be substituted by a halogen atom, a hydroxyl group, or a $C_{1-4}$ alkyl group; and R represents a $C_{2-10}$ alkylene group, a $C_{6-18}$ cycloalkylene group, an arylene group, or a $C_{13-25}$ alkylidene diarylene group, wherein these groups may be substituted by a halogen atom, a hydroxyl group, or a $C_{1-4}$ alkyl group; and n is a positive number.)

[Chemical 10]

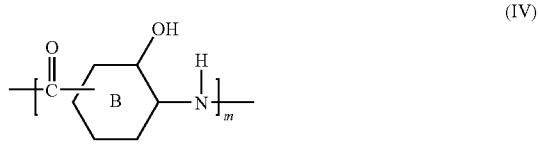

(IV)

(In the general formula (IV), ring-B represents a $C_{6-18}$ arylene group or a $C_{13-25}$ alkylidene diarylene group, wherein these groups may be substituted by a halogen atom, a hydroxyl group, or a $C_{1-4}$ alkyl group; and m is a positive number.)

The arylene group represented by the ring-A in the general formula (III) may include the same groups as mentioned in the general formula (I).

The alkylidene diarylene group represented by the ring-A in the general formula (III) may include the same groups as mentioned in the general formula (I).

The $C_{2-10}$ alkylene group represented by R in the general formula (III) may include the same groups as mentioned in the general formula (I).

The $C_{6-18}$ cycloalkylene group represented by R in the general formula (III) may include the same groups as mentioned in the general formula (I).

The arylene group represented by R in the general formula (III) may include the same groups as mentioned in the general formula (I).

The alkylidene diarylene group represented by R in the general formula (III) may include the same groups as mentioned in the general formula (I).

The arylene group represented by the ring-B in the general formula (IV) may include the same groups as mentioned in the general formula (II).

The alkylidene diarylene group represented by the ring-B in the general formula (IV) may include the same groups as mentioned in the general formula (II).

The polyamide compound used in the present invention is preferably a compound in which the ring-A and/or R in the general formula (I) or general formula (III) is a phenylene group or a naphthylene group.

The specific chemical structure of the polyamide compound used in the present invention may include, for example, the following chemical structures No. 1 to 13. Note that, the present invention is not limited by the following chemical structures.

[Chemical 11]
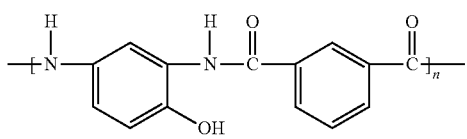
No. 1
[Chemical 12]
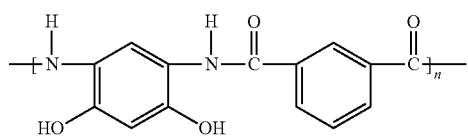
No. 2
[Chemical 13]
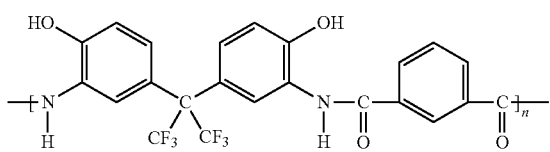
No. 3
[Chemical 14]
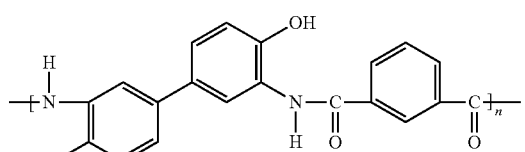
No. 4
[Chemical 15]
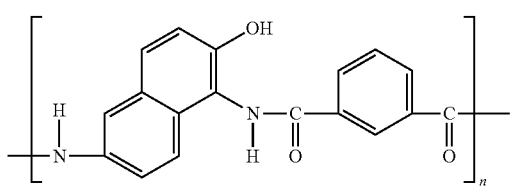
No. 5
[Chemical 16]
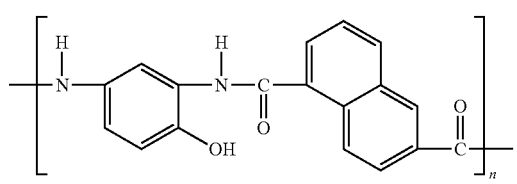
No. 6
[Chemical 17]
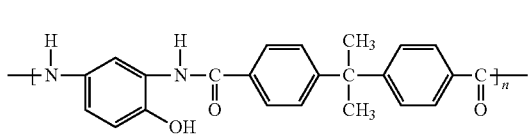
No. 7
[Chemical 18]
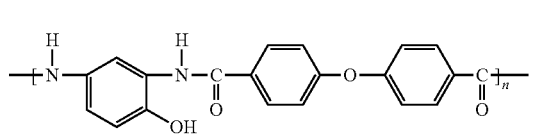
No. 8
[Chemical 19]
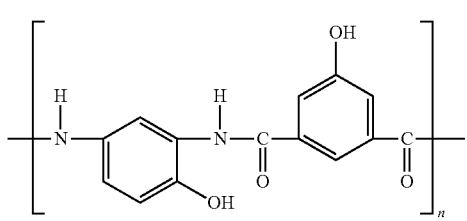
No. 9
[Chemical 20]
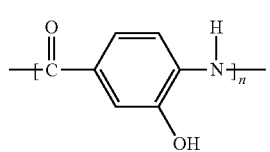
No. 10
[Chemical 21]
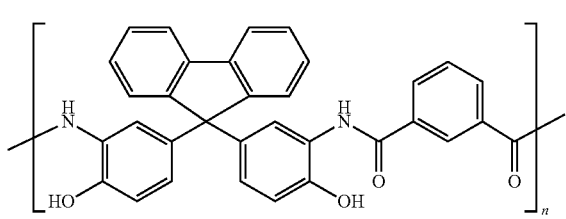
No. 11
[Chemical 22]
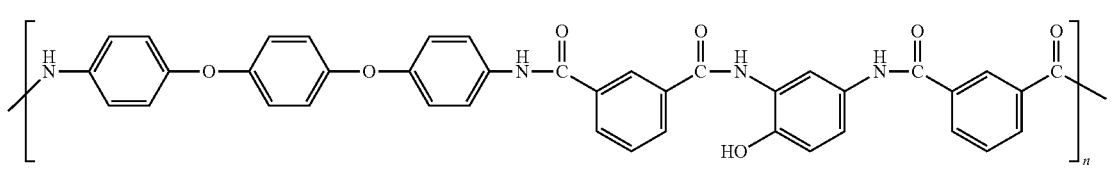
No. 12

[Chemical 23]

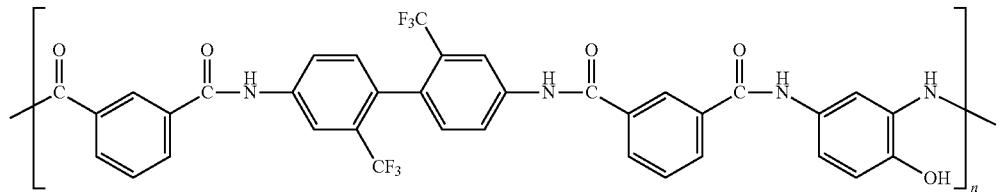

No. 13

The polyamide compound used in the present invention can be obtained from a phenolic hydroxyl group-containing aromatic diamine that has a phenolic hydroxyl group at the position adjacent to an amino group. Namely, the polyamide compound used in the present invention is a polyamide compound that is constituted by a phenolic hydroxyl group-containing aromatic diamine that has a phenolic hydroxyl group at the position adjacent to an amino group and a dicarboxylic acid (including various kinds of aromatic dicarboxylic acids and aliphatic dicarboxylic acids) that are to used as source materials. The number of the phenolic hydroxyl group at the position adjacent to an amino group is not particularly limited, but is for example from one to four per aromatic diamine molecule that is one of the source materials.

A diamine compound (including aromatic diamines and aliphatic diamines) besides the diamine that has a phenolic hydroxyl group at the position adjacent to an amino group may be further used as one of the source materials to constitute the polyamide compound of the present invention. Further, a dicarboxylic acid having a phenolic hydroxyl group may be used.

The phenolic hydroxyl group-containing aromatic diamine that has a phenolic hydroxyl group at the position adjacent to an amino group may include, for example, the one that has from one to four hydroxyl groups at the position adjacent to the amino group in the aromatic diamine such as m-phenylenediamine, p-phenylenediamine, m-tolylenediamine, 4,4'-diaminodiphenylether, 3,3'-dimethyl-4,4'-diaminodiphenyl-ether, 3,4'-diaminodiphenylether, 4,4'-diaminodiphenylthioether, 3,3'-dimethyl-4-4'-diaminodiphenylthioether, 3,3'-diethoxy-4,4'-diaminodiphenylthioether, 3,3'-diaminodiphenylthioether, 4,4'-diaminobenzophenone, 3,3'-dimethyl-4,4'-diaminobenzophenone, 3,3'-diaminodiphenylmethane, 4,4'-diaminodiphenyl-methane, 3,4'-diaminodiphenylmethane, 3,3'-dimethoxy-4,4'-diaminodiphenyl-thioether, 2,2'-bis(3-aminophenyl)propane, 2,2'-bis(4-aminophenyl)propane, 4,4'-diaminodiphenylsulfoxide, 4,4'-diaminodiphenylsulfone, b enzidine, 3,3'-dimethylbenzidine, 3,3'-dimethoxybenzidine, 3,3'-diaminobiphenyl, p-xylylenediamine, m-xylylenediamine, o-xylylenediamine, 2,2'-bis(3-amino-phenoxyphenyl)propane, 2,2'-bis(4-aminophenoxyphenyl)propane, 1,3-bis(4-aminophenoxyphenyl)benzene, 1,3'-bis(3-aminophenoxyphenyl)propane, bis(4-amino-3-methylphenyl)methane, bis(4-amino-3,5-dimethylphenyl)methane, bis(4-amino-3-ethylphenyl) methane, bis(4-amino-3,5-diethylphenyl)methane, bis(4-amino-3-propylphenyl)methane, bis(4-amino-3,5-dipropylphenyl)methane, and 2,2'-bis(3-aminophenyl) hexafluoropropane, and 2,2'-bis(4-aminophenyl) hexafluoropropane. The aromatic diamine is not limited by the diamines listed above. One kind alone may be used or two or more kinds may be used in combination. The aromatic diamine that has no hydroxyl groups bonded thereto may be used in combination, which may include the source aromatic diamines listed above.

The dicarboxylic acids that react with the phenolic hydroxyl group-containing aromatic diamine having a phenolic hydroxyl group at the position adjacent to an amion group to constitute the polyamide compound of the present invention may include, for example, phthalic acid, isophthalic acid, terephthalic acid, 4,4'-oxybibenzoic acid, 4,4'-biphenyl dicarboxylic acid, 3,3'-methylene bibenzoic acid, 4,4'-methylene bibenzoic acid, 4,4'-thiobibenzoic acid, 3,3'-carbonyl bibenzoic acid, 4,4'-carbonyl bibenzoic acid, 4,4'-sulfonyl bibenzoic acid, 1,5-naphthalene dicarboxylic acid, 1,4-naphthalene dicarboxylic acid, 2,6-naphthalene dicarboxylic acid, 1,2-naphthalene dicarboxylic acid, 5-hydroxyisophthalic acid, 4-hydroxyisophthalic acid, 2-hydroxyisophthalic acid, 3-hydroxyisophthalic acid, 2-hydroxyterephthalic acid, 2,2'-bis(3-carboxyphenyl)hexafluoropropane, and 2,2'-bis(4-carboxyphenyl)hexafluoropropane. The dicarboxylic acids are not limited to the dicarboxylic acids listed above. One kind alone may be used or two or more kinds may be used in combination.

There is no particular limitation on the epoxy resin used for the hardenable epoxy resin composition of the present invention, and aromatic epoxy compounds, alicyclic epoxy compounds, aliphatic epoxy compounds or the like known in the art are used. The aromatic epoxy compounds may include, for example, a glycidylether compound of a polyphenol such as hydroquinone, resorcinol, bisphenolA, bisphenolF, 4,4'-dihydroxybiphenyl, novolac, tetrabromobisphenolA, 2,2-bis(4-hydroxyphenyl)-1,1,1,3,3,3-hexafluoropropane, and 1,6-dihydroxynaphthalene. The alicyclic epoxy compounds may include a polyglycidylether of a polyol that has at least one alicyclic ring, and a cyclohexeneoxide- or cyclopenteneoxide-containing compound that is obtained by epoxidizing a cyclohexene or cyclopentene ring-containing compound with an oxidizing agent. For example, there may be listed hydrogenated bisphenolA diglycidylether, 3,4-epoxycyclohexylmethyl-3,4-epoxycyclohexylcarboxylate, 3,4-epoxy-1-methylcyclohexyl-3,4-epoxy-1-methylhexanecarboxylate, 6-methyl-3,4-epoxycyclohexymethyl-6-methyl-3,4-epoxycyclohexanecarboxylate, 3,4-epoxy-3-methylcyclohexylmethyl-3,4-epoxy-3-methylcyclohexanecarboxylate, 3,4-epoxy-5-methylcyclohexylmethyl-3,4-epoxy-5-methylcyclohexanecarboxylate, bis(3,4-epoxycyclohexylmethyl)adipate, methylenebis(3,4-epoxycyclohexane), 2,2-bis(3,4-epoxycyclohexyl)propane, dicyclopentadienediepoxide, ethylenebis(3,4-epoxycyclohexanecarboxylate), epoxyhexahydro dioctylphthalate, epoxyhexahydro di-2-ethylhexylphthalate, and the like. The aliphatic epoxy compounds may include polyglycidylethers of aliphatic polyols or their alkyleneoxide adduct, polyglycidylesters of aliphatic long-chain polybasic acids, homopolymers prepared by vinylpolymerizing glycidylacrylate or glycidylmethacrylate, and copolymers prepared by vinylpolymerizing glycidylacrylate or glycidylmethacrylate with the other vinyl monomers. As the typical compounds, there may be listed a polyol glycidylether such as 1,4-butanediol diglycidylether, 1,6-hexanediol diglycidylether, triglycidylether of glycerin, triglycidylether of trimethylolpropane, tetraglycidylether of sorbitol, hexaglycidylether of dipentaerythrytol, diglycidylether of polyethyleneglycol, and diglycidylether of polypropyleneglycol; a polyetherpolyol polyglycidylether that is obtained by adding at least one kind or two or more kinds of alkyleneoxide to an aliphatic polyol such as propyleneglycol, trimethylolpropane, and glycerin; and a diglycidylester of an aliphatic long-chain dibasic acid. Further, there may be listed a monoglycidylether of an aliphatic higher alcohol; monoglycidylether of phenol, cresol or butylphenol or a polyetheralcohol that is obtained by adding an alkyleneoxide to the former compounds; a higher fatty acid glycidylester; an epoxized soybean oil; octylepoxystearate; butylepoxystearate; epoxized polybutadiene; and the like.

In the hardenable epoxy resin composition of the present invention, the polyamide compound works as an epoxy resin hardener. There is no particular limitation on the used amount of the polyamide compound (hardener) in the hardenable epoxy resin composition of the present invention. Typically, the amount is selected in such a manner that the ratio of the total epoxy mol number of the epoxy compound to the functional group number of the hardener becomes from 0.9/1.0 to 1.0/0.9.

Further, a hardener substituted by fluorine is desirable because the hardener provides an epoxy resin composition having low water absorption. However, a fluorine-substituted compound is generally expensive and, therefore, is selected as appropriate in view of the other properties and the like in accordance with applications.

Still further, an epoxy resin hardener other than the polyamide compound may be used. When the polyamide compound is used in combination with the other hardener, the viscosity or hardening property of the resulting hardenable composition and the properties after hardened can be expected to be controlled. As the other hardeners, there may be listed a latent hardener, a polyamine compound, a polyphenol compound, a cationic photo-initiator or the like.

As the latent hardeners, there may be listed dicyandiamides, hydrazides, imidazole compounds, amine adducts, sulfonium salts, onium salts, ketimines, acid anhydrides, tert-amines, and the like. These latent hardeners are desirable because they provide a single liquid type hardenable composition, which is easy to handle.

As the acid anhydrides, there may be listed, for example, phthalic anhydride, trimellitic anhydride, pyromellitic anhydride, tetrahydrophthalic anhydride, hexahydrophthalic anhydride, maleic anhydride, succinic anhydride, 2,2-bis(1,4-dicarboxyphenyl)-1,1,1,3,3,3-hexafluoropropane bianhydride, and the like.

As the polyamine compounds, there may be listed, for example, an aliphatic polyamine such as ethylenediamine, diethylenetriamine, triethylenetetramine; an alicyclic polyamine such as menthene diamine, isophoronediamine, bis(4-amino-3-methylcyclohexyl)methane, bis(aminomethyl)cyclohexane, and 3,9-bis(3-aminopropyl) 2,4,8,10-tetraoxaspiro[5,5]undecane; an aliphatic amine having an aromatic ring such as m-xylenediamine; and an aromatic polyamine such as m-phenylenediamine, 2,2-bis(4-aminophenyl)propane, diaminodiphenylmethane, diaminodiphenylsulfone, a,a-bis(4-aminophenyl)-p-diisopropylbenzene, and 2,2-bis(4-aminophenyl)-1,1,1,3,3,3-hexafluoropropane.

As the polyphenol compounds, there may be listed, for example, phenolnovolak, o-cresolnovolak, t-butylphenolnovolak, dicyclopentadiene cresol, terpene diphenol, terpene dicatechol, 1,1,3-tris(3-tert-butyl-4-hydroxy-6-methylphenyl)butane, butylidenebis(3-tert-butyl-4-hydroxy-1-6-methylphenyl), 2,2-bis(4-hydroxyphenyl)-1,1,1,3,3,3-hexafluoropropane, or the like. Phenolnovolak is desirable because the electrical properties and mechanical strength of the resulting epoxy resin are fit for laminated sheets.

As the imidazole compounds, there may be listed, for example, various kinds of imidazoles such as 2-methylimidazole, 2-phenylimidazole, 2-undecylimidazole, 2-heptadecylimidazole, 2-phenyl-4-methylimidazole, 1-benzyl-2-phenylimidazole, 1-benzyl-2-methylimidazole, 1-cyanoethyl-2-methylimidazole, 1-cyanoethyl-2-phenylimidazole, 1-cyanoethyl-2-undecylimidazole, 2,4-diamino-6(2'-methylimidazole(1'))ethyl-s-triazine, 2,4-diamino-6(2'-undecylimidazole(1'))ethyl-s-triazine, 2,4-diamino-6(2'-ethyl-4-methylimidazole(1')) ethyl-s-triazine, an isocyanuric acid adduct of 2,4-diamino-6(2'-methylimidazole(1')) ethyl-s-triazine, a 2:3 isocyanuric acid adduct of 2-methylimidazole, an isocyanuric acid adduct of 2-phenylimidazole, 2-phenyl-3,5-dihydroxymethylimidazole, 2-phenyl-4-hydroxymethyl-5-methylimidazole, and 1-cyanoethyl-2-phenyl-3,5-dicyanoethoxymethylimidazole; and the salts of these imidazoles and polycarboxylic acids such as phthalic acid, isophthalic acid, terephthalic acid, trimellitic acid, pyromellitic acid, naphthalenedicarboxylic acid, maleic acid, and oxalic acid.

The cationic photo-initiator usable in the present invention has a capability of releasing, by energy ray irradiation, a substance that initiates cation polymerization, and is particularly preferably an onium double salt or its derivative that releases a Lewis acid by irradiation. As a typical compound of such a cationic photo-initiator, there may be mentioned a salt of a cation and an anion represented by the following formula:

$$[A]^{m+}[B]^{m-}$$

In the above formula, the cation $[A]^{m+}$ is desirably an onium, which has a molecular structure, for example, represented by the following formula:

$$[(R^1)_a Q]^{m+}$$

In the above formula, $R^1$ is a $C_{1-60}$ organic group that may contain any atom other than carbon atom in any number; a is an integer of from 1 to 5; when a is from 2 to 5, plural $R^1$s may be independently identical or different; at least one of $R^1$s is desirably an organic group having an aromatic ring; Q is an atom or atomic group selected from the group consisting of S, N, Se, Te, P, As, Sb, Bi, 0, I, Br, Cl, F, and N=N; and when the valency of Q in the cation $[A]_{m+}$ is q, the relation of m=a−q should be held (note that, the valency of N=N is taken as 0).

The anion $[B]^{m-}$ is desirably a halogenated complex, which has a molecular structure, for example, represented by the following formula:

$$[L_b]^{m-}$$

In the above formula, L is the central atom of the halogenated complex and is a metal or metalloid including B, P, As, Sb, Fe, Sn, Bi, Al, Ca, In, Ti, Zn, Sc, V, Cr, Mn and Co; X is a halogen atom; b is an integer of from 3 to 7; and when the valency of L in the anion $[B]^{m-}$ is p, the relation of m=b−p should be held.

A specific example of the anion represented by the foregoing general formula $[LX_b]^{m-}$ may include tetrafluoroborate $(BF_4)^-$, hexafluorophosphate $(PF_6)^-$, hexafluoroantimonate $(SbF_6)^-$, hexafluoroarsenate $(AsF_6)^-$, and hexachloroantimonate $(SbCl_6)^-$.

As the anion [B]$^{m-}$, there may be used desirably an anion having the structure represented by $$[LX_{b-1}(OH)]^{n-}.$$

L, X, and b are the same as described above. The other anion usable may include perchlorate ion (ClO$_4$)$^-$, trifluoromethylsulfite ion (CF$_3$SO$_3$)$^-$, fluorosulfonate ion (FSO$_3$)$^-$, toluene sulfonate anion, and trinitrobenzene sulfonate anion.

In the present invention, the following (a) to (c) aromatic onium salts are particularly effectively used among the above onium salts. The aromatic onium salts may be used with one kind alone or two or more kinds in combination.

(a) An aryldiazonium salt such as phenyldiazonium hexafluorophosphate, 4-methoxyphenyldiazonium hexafluoroantimonate, and 4-methylphenyldiazonium hexafluorophosphate;

(b) A diaryliodonium salt such as diphenyliodonium hexafluoroantimonate, di(4-methylphenyl)iodonium hexafluorophosphate, and di(4-tert-butylphenyl)iodonium hexafluorophosphate; and (c) A triarylsulfonium salt such as triphenylsulfonium hexafluoroantimonate, tris(4-methoxyphenyl)sulfonium hexafluorophosphate, diphenyl-4-thiophenoxy phenylsulfonium hexafluoroantimonate, diphenyl-4-thiophenoxyphenylsulfonium hexafluorophosphate, 4,4'-bis(diphenylsulfonio)phenylsulfide-bis-hexafluoro antimonate, 4,4'-bis(diphenylsulfonio)phenylsulfide-bis-hexafluorophosphate, 4,4'-bis[di(β-hydroxyethoxy)phenylsulfonio]phenylsulfide-bis-hexafluoroantimonate, 4,4'-bis[di(β-hydroxyethoxy)phenylsulfonio]phenylsulfide-bis-hexafluorophosphate, 4-[4'-(benzoyl)phenylthio]phenyl-di(4-fluorophenyl)sulfonium hexafluoroantimonate, and 4-[4'-(benzoyl)phenylthio]phenyl-di(4-fluorophenyl)sulfonium hexafluoro-phosphate.

The other preferred one may include an iron-arene complex such as (η$^5$-2,4-cyclopentadiene-1-yl) [(1,2,3,4,5,6,-η)-(1-methylethy)benzene]-iron-hexa fluorophosphates, and a mixture of an aluminum complex and a silanol such as triphenylsilanol, wherein the aluminum complex includes tris(acetylacetonato) aluminum, tris(ethylacetonatoacetato) aluminum, and tris(salicylaldehydato) aluminum.

Among these, considering practical applications and optical sensitivity, the aromatic iodonium salts, aromatic sulfonium salts, or iron-arene complex is desirably used.

These photo-initiators may be used in combination with one kind or two or more kinds of a known optical polymerization promoter such as a benzoic acid type or tert-amine type promoter. The photo-initiators are contained in an amount of desirably from 0.1 wt % to 30 wt % in the composition of the present invention. If the amount is less than 0.1 wt %, the effect of the addition would possibly be not obtained. If the amount is more than 30 wt %, the mechanical strength of the resulting hardened material would be possibly lowered.

As a light source used for polymerization using the photo-initiator, there may be mentioned a known light source such as a high pressure mercury lamp, a metal halide lamp, and a xenon lamp. Active energy rays such as UV light, electron beam, X-rays, radiation rays, and high-frequency waves are irradiated by such a light source so as to release a Lewis acid from the aforementioned photo-initiators and to harden the aforementioned epoxy compounds. A light source having a wavelength of 400 nm or less is effective.

As the method for hardening the hardenable epoxy resin composition of the present invention that uses the polyamide compound as a hardener, any method so far conventionally known for hardening epoxy resin can be used. The method may include a hardening method using a hardener, a hardening method by self-polymerization using a hardening catalyst, a photo-hardening method using a photo-initiator, and a hardening speed regulation using a hardening promoter in combination.

The hardenable epoxy resin composition of the present invention can be admixed with a flame retardant such as a phosphorous-based flame retardant. The flame retardant is admixed in an amount of desirably from 5 to 100 parts by mass based on 100 parts by mass of the total mixed amount of epoxy resin and hardener. The flame retardant is desirably a phosphorous acid amide compound represented by the following general formula (V).

[Chemical 24]

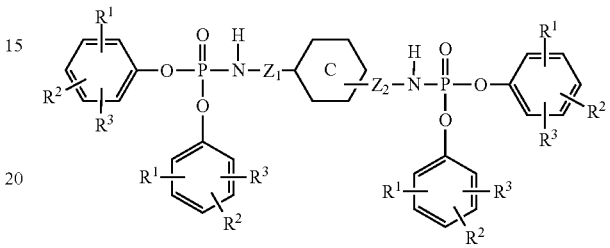

(V)

(In the general formula (V), R$^1$, R$^2$ and R$^3$ each represents a hydrogen atom, a C$_{1-8}$ alkyl, a cycloalkyl group, or a halogen atom; Z$_1$ and Z$_2$ each represents a direct bonding, a C$_{1-4}$ alkylene group, or a alkylidene group; and ring-C represents a C$_{6-18}$ arylene group, a cycloalkylene group, or an arylene-alkylene(alkylidene)-arylene group.)

The hardenable epoxy resin composition of the present invention provides a hardened material having excellent properties (including high glass transition temperature, low linear expansion coefficient, tensile strength, elongation, and flexibility) without being admixed with a filler. However, a filler can be also desirably used.

As the filler, there may be desirably used, a fibrous filler such as glass fiber, aluminum borate whisker, boron nitride whisker, potassium titanate whisker, and is titanium oxide whisker; and a spherical filler of silica, fused silica, and alumina. In particular, spherical silica or spherical fused silica is desirable from the viewpoint of the properties of the hardened material (including high glass transition temperature, low linear expansion coefficient, tensile strength, elongation, and flexibility). The filler is not limited to fibrous or spherical form. There may be used silica, alumina, aluminum borate, aluminum nitride, boron nitride, potassium titanate, titanium oxide, and the like. In addition, as the filler, there may be listed talc, mica, calcium carbonate, glass flakes, glass beads, glass balloons, calcium silicate, aluminum hydroxide, barium sulfate, magnesia, ferrite, various kinds of metal fine particles, graphite, carbon, inorganic fibers such as carbon fibers, boron fibers, silicon carbide fibers, alumina fibers, and silica alumina fibers, organic fibers such as aramid fibers, polyester fibers, cellulose fibers, and carbon fibers, and the like. The filler is contained in an amount of preferably from 0.1 to 80 mass % and more preferably from 30 to 70 mass % in the hardenable epoxy resin composition of the present invention.

The long axis length or aspect ratio of the fibrous filler is desirably selected as appropriate in accordance with applications. A fine spherical particle with a smaller particle diameter, particularly having an average particle diameter of from 0.1 to 20 μm is desirable as the spherical filler.

It is desirable that the hardenable epoxy resin composition of the present invention be admixed with a phenolnovolak resin because the plating peel strength of the resulting hardened material can be increased. A preferred phenolnovolak resin may include phenol-formaldehyde novolak, phenol-aralkyl novolak, and phenol-biphenyl novolak and the like.

The phenolnovolak resin is contained in an amount of preferably from 1 to 60 mass % and more preferably from 10 to 40 mass % in the hardenable epoxy resin composition of the present invention.

The hardenable epoxy resin composition of the present invention may be admixed optionally with the other additives. For example, the other additives may include a plasticizer such as natural wax, synthetic wax, and long chain fatty acid metal salts; a mold releasing agent such as acid amides, esters, and paraffin; a stress relaxation agent such as nitrile rubber and butadiene rubber; an inorganic flame retardant such as antimony trioxide, antimony pentaoxide, tin oxide, tin hydroxide, molybdenum oxide, zinc borate, barium metaborate, red phosphorus, aluminum hydroxide, magnesium hydroxide, and calcium aluminate; a bromine-based flame retardant such as tetrabromo bisphenol A, tetrabromo phthalic anhydride, hexabromo benzene, and brominated phenolnovolak; a phosphorous-based flame retardant besides the ones described above; a coupling agent such as a silane coupling agent, a titanate coupling agent, and an aluminum coupling agent; a coloring agent such as dyes and pigments; an oxidation stabilizer; a light stabilizer; a damp-resistance improver; a thixotropy extender; a diluent; a defoaming agent; various kinds of the other resins; a tackifier; an antistatic agent; a lubricant; a UV absorber; and an organic solvent such as alcohols, ethers, acetals, ketones, esters, alcohol esters, ketone alcohols, ether alcohols, ketone ethers, ketone esters, ester ethers, and aromatic solvents.

The hardenable epoxy resin composition of the present invention can be used with a conventional method for obtaining a prepreg, wherein the hardenable epoxy resin composition is diluted into a varnish with an adequate organic solvent such as propyleneglycol monomethylether; the varnish is coated on or impregnated in a porous glass base such as a non-woven or woven cloth of glass fibers; and then they are subjected to the heating process. Further, a plurality of the prepregs is stuck together; after copper foil is disposed on one or both surfaces of the resulting laminated structure, the whole structure is heated under pressure under a normal condition to obtain a copper-clad glass epoxy laminate. On this occasion, if no copper foil is used, a laminated sheet can be obtained. In addition, a multi-layered board can be obtained through such a conventional process that a circuit is formed on the copper-clad glass epoxy laminate (serving as an inside layer); the copper foil is etched; the prepreg and copper foil are disposed on at least one surface of the inside layer; and then the whole structure is heated under pressure, for example, at 170° C. and 40 kg/cm² for 90 minutes. Further, a printed circuit board can be produced by such an usual method that, through holes are formed in the copper-clad grass epoxy laminate or multi-layered board; the through holes are plated; and then a predetermined circuit is formed.

The hardenable epoxy resin composition of the present invention can be used in various applications of conventionally-known epoxy resins including various kinds of electronic or electrical materials used for electronic circuit boards such as the aforementioned copper clad laminate, the aforementioned prepreg, the aforementioned printing circuit board, a sealing material, a potting material, an adhesive, and an electrical insulating paint; paints such as a powder paint and an anticorrosion paint; adhesives; and building materials.

EXAMPLE

The present invention will be explained in detail with accompanied examples. It is construed that the present invention is not limited at all by these examples.

Synthesis Example 1

Synthesis of the Polyamide Compound (Example Polymer 4) Having the Chemical Structure No. 4

To a solution dissolving 9.73 g (0.045 mol) of 3,3'-diamino-4,4'-dihydroxybiphenyl in a mixture of 40 g of N-methylpyrrolidone (hereinafter, abbreviated as NMP) and 15.33 g of pyridine, a solution dissolving 10.05 g (0.0495 mol) of isophthaloylchloride in 40 g of NMP was added dropwise at a temperature of from −15° C. to 0° C. They were reacted for 2 hours while the temperature was kept at from −15° C. to 0° C., and further reacted for 2 hours at room temperature. After re-precipitation with about 2 liters of ion-exchange water, the resultant precipitate was filtered off and dried at 150° C. for 3 hours under a reduced pressure to obtain 15 g of white powder (yield: 79.1%).

The formation of amide bonding in the resulting white powder compound was confirmed by the infrared absorption spectrum. The white powder compound was confirmed to be a polymer having a weight average molecular weight of 1900 that was determined by gel permeation chromatography. Further analysis showed that the viscosity was 350 cps (at 25° C., in a 30 wt % NMP solution) and that the OH equivalence was 190 g/eq.

Synthesis Examples 2 to 16

The following example polymers 1 to 17 were synthesized with the synthesis manner in Synthesis Example 1 applied correspondingly. The weight average molecular weight, viscosity, and OH equivalence of each example polymer obtained are shown below.

[Chemical 25]

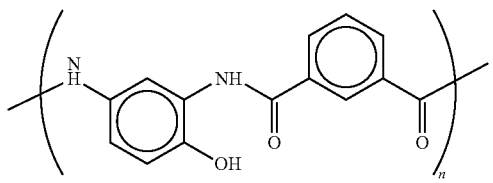

Example polymer 1

Viscosity: 150 cps
(25° C., 30 wt % NMP solution)
Weight average molecular weight: 1400
OH equivalence: 285 g/eq

[Chemical 26]

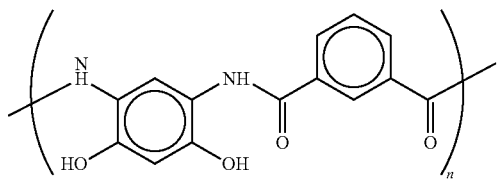

Example polymer 2

Viscosity: 2000 cps
(25° C., 30 wt % NMP solution)
Weight average molecular weight: 1500
OH equivalence: 150 g/eq

[Chemical 27]

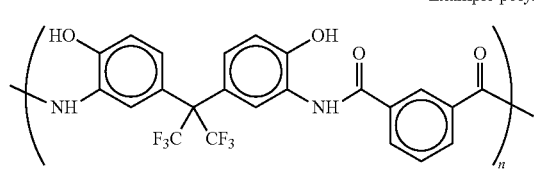

Example polymer 3

Viscosity: 250 cps
(25° C., 30 wt % NMP solution)
Weight average molecular weight: 2600
OH equivalence: 260 g/eq

[Chemical 28]

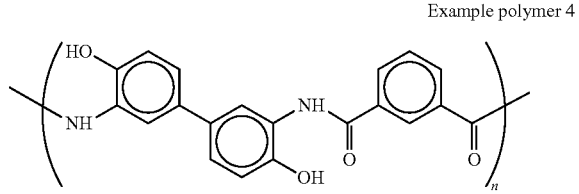

Example polymer 4

Viscosity: 350 cps
(25° C., 30 wt % NMP solution)
Weight average molecular weight: 1900
OH equivalence: 190 g/eq

[Chemical 29]

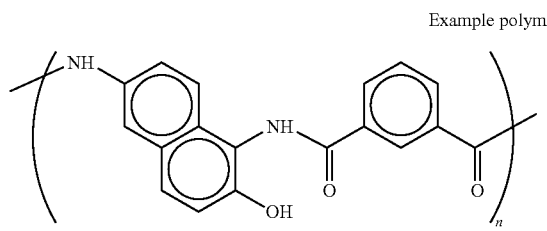

Example polymer 5

Viscosity: 300 cps
(25° C., 30 wt % NMP solution)
Weight average molecular weight: 1700
OH equivalence: 335 g/eq

[Chemical 30]

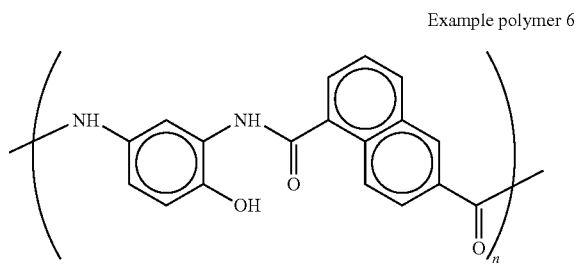

Example polymer 6

Viscosity: 400 cps
(25° C., 30 wt % NMP solution)
Weight average molecular weight: 3300
OH equivalence: 335 g/eq

[Chemical 31]

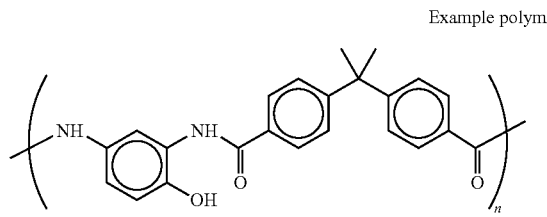

Example polymer 7

Viscosity: 350 cps
(25° C., 30 wt % NMP solution)
Weight average molecular weight: 4000
OH equivalence: 405 g/eq

[Chemical 32]

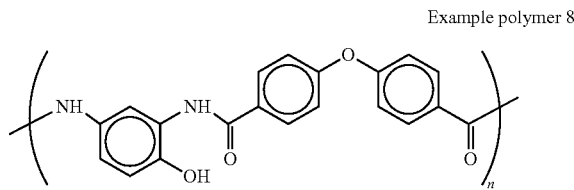

Example polymer 8

Viscosity: 350 cps
(25° C., 30 wt % NMP solution)
Weight average molecular weight: 3750
OH equivalence: 375 g/eq

[Chemical 33]

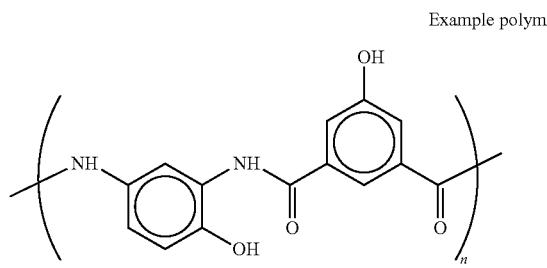

Example polymer 9

Viscosity: 450 cps
(25° C., 30 wt % NMP solution)
Weight average molecular weight: 3300
OH equivalence: 165 g/eq

[Chemical 34]

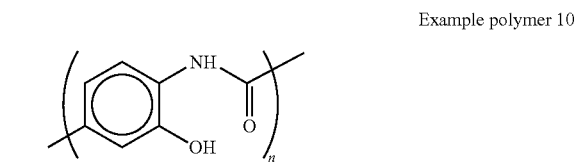

Example polymer 10

Viscosity: 200 cps
(25° C., 30 wt % NMP solution)
Weight average molecular weight: 1700
OH equivalence: 165 g/eq

[Chemical 35]

Example polymer 11

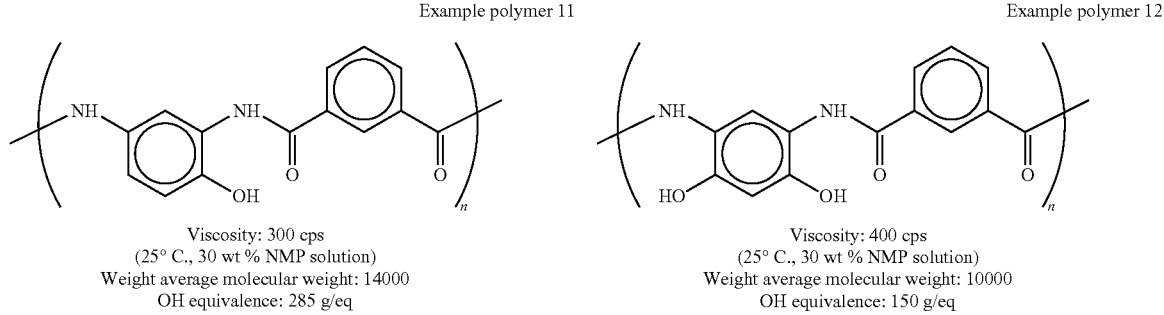

Viscosity: 300 cps
(25° C., 30 wt % NMP solution)
Weight average molecular weight: 14000
OH equivalence: 285 g/eq

[Chemical 36]

Example polymer 12

Viscosity: 400 cps
(25° C., 30 wt % NMP solution)
Weight average molecular weight: 10000
OH equivalence: 150 g/eq

[Chemical 37]

Example polymer 13

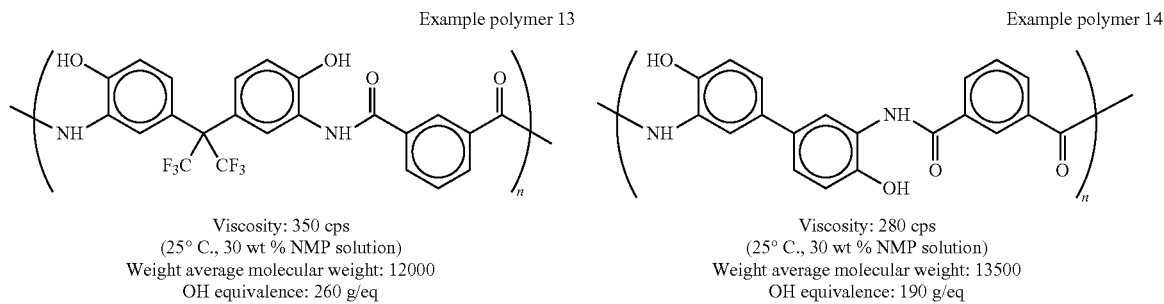

Viscosity: 350 cps
(25° C., 30 wt % NMP solution)
Weight average molecular weight: 12000
OH equivalence: 260 g/eq

[Chemical 38]

Example polymer 14

Viscosity: 280 cps
(25° C., 30 wt % NMP solution)
Weight average molecular weight: 13500
OH equivalence: 190 g/eq

[Chemical 39]

Example polymer 15

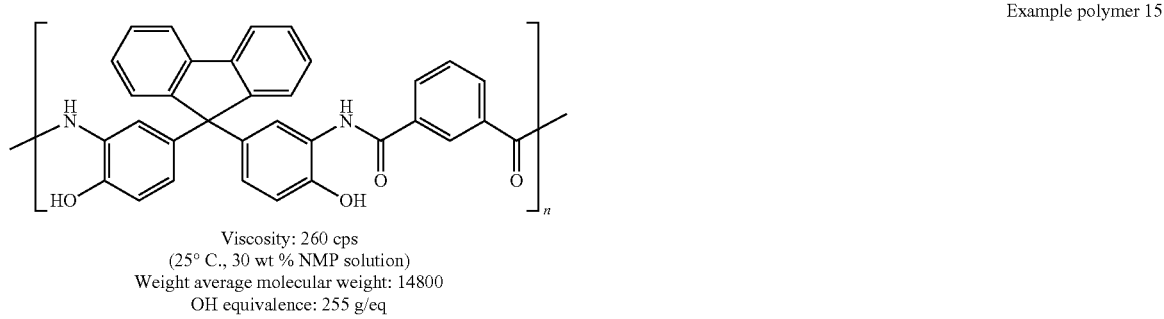

Viscosity: 260 cps
(25° C., 30 wt % NMP solution)
Weight average molecular weight: 14800
OH equivalence: 255 g/eq

[Chemical 40]

Example polymer 16

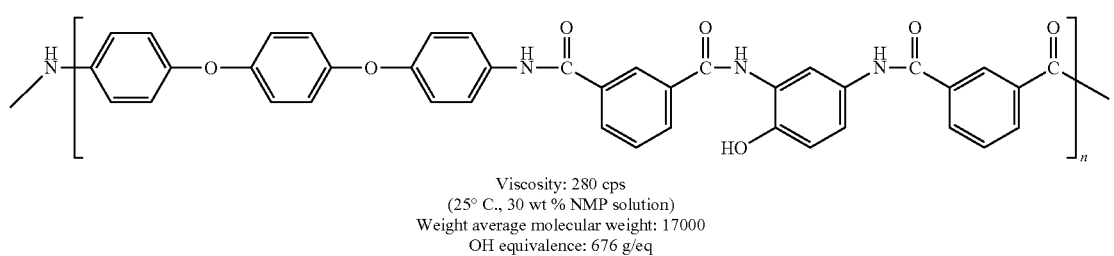

Viscosity: 280 cps
(25° C., 30 wt % NMP solution)
Weight average molecular weight: 17000
OH equivalence: 676 g/eq

[Chemical 41]

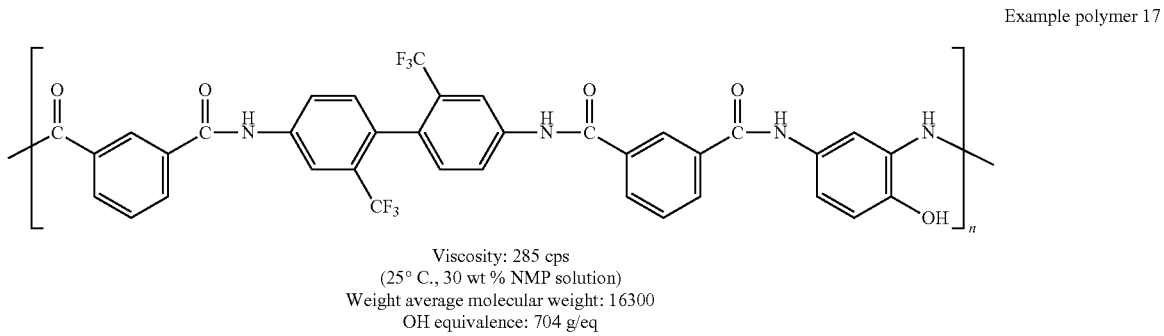

Example polymer 17

Viscosity: 285 cps
(25° C., 30 wt % NMP solution)
Weight average molecular weight: 16300
OH equivalence: 704 g/eq Examples 1 to 10 and Comparative Examples 1 to 2

Hardenable epoxy resin compositions were prepared with using the example polymers obtained in the Synthesis Examples or the comparative polymers described below in the mixing ratios described in Tables 1 and 2. The mixing ratio is given in parts by weight. The hardened materials of the hardenable epoxy resin compositions were evaluated in terms of chemical resistance, glass transition temperature, linear expansion coefficient, tensile strength, and elongation. The results are shown in Tables 1 and 2.

The chemical resistance was evaluated as follows: a cotton applicator was dipped in N-methylpyrrolidone and drawn up; after confirming that drip of N-methylpyrrolidone from the cotton applicator stopped, the surface of a hardened material of resin, over about 5 cm long, was rubbed with the cotton applicator; at every 10 times of rubbing, the cotton applicator was re-dipped in N-methylpyrrolidone; and the number of the rubbing time was counted until the hardened material started to dissolve. The dissolution of the hardened material was detected by visual observation.

The glass transition temperature was measured using the dynamic viscoelastic method.

The linear expansion coefficient was measured for a sample that was cut out into a strip 2 cm wide and 10 cm long.

The tensile strength and elongation were measured in accordance with JIS-K6911.

TABLE 1

|  | Example 1 | Example 2 | Example 3 | Example 4 | Example 5 | Example 6 |
|---|---|---|---|---|---|---|
| Example polymer 1 | 10 | | | | | |
| Example polymer 2 | | 10 | | | | |
| Example polymer 3 | | | 10 | | | |
| Example polymer 4 | | | | 10 | | |
| Example polymer 5 | | | | | 10 | |
| Example polymer 6 | | | | | | 10 |
| Epoxy resin 1[*1] | 4.8 | 9.1 | 5.2 | 7.2 | 4.1 | 4.8 |
| Triphenyl phosphine | 0.44 | 0.57 | 0.46 | 0.52 | 0.42 | 0.44 |
| NMP[*2] | 35.6 | 45.9 | 36.5 | 41.3 | 33.9 | 35.6 |
| Chemical resistance (times) | >100 | >100 | >100 | >100 | >100 | >100 |
| Glass transition temperature (° C.) | 210 | 250 | 220 | 230 | 225 | 220 |
| Linear expansion coefficient (ppm) | 38 | 40 | 45 | 35 | 30 | 33 |
| Tensile strength (MPa) | 90 | 85 | 105 | 90 | 100 | 100 |
| Elongation (%) | 10 | 9 | 12 | 10 | 10 | 11 |

TABLE 2

|  | Example 7 | Example 8 | Example 9 | Example 10 | Comparative Example 1 | Comparative Example 2 |
|---|---|---|---|---|---|---|
| Example polymer 7 | 10 | | | | | |
| Example polymer 8 | | 10 | | | | |
| Example polymer 9 | | | 10 | | | |
| Example polymer 10 | | | | 10 | | |
| Comparative polymer 1*[3] | | | | | 10 | |
| Comparative polymer 2*[4] | | | | | | 10 |
| Epoxy resin 1*[1] | | | | 8.2 | 4.8 | |
| Epoxy resin 2*[5] | 4.2 | | | | | |
| Epoxy resin 3*[6] | | 3.2 | | | | 4.2 |
| Epoxy resin 4*[7] | | | 10.9 | | | |
| Triphenyl phosphine | 0.43 | 0.40 | 0.63 | 0.55 | 0.44 | 0.43 |
| NMP | 35.6 | 34.1 | 31.7 | 50.2 | 35.6 | 34.1 |
| Chemical resistance (times) | >100 | >100 | >100 | >100 | 10 | 15 |
| Glass transition temperature (° C.) | 280 | 230 | 220 | 210 | Unmeasurable | Unmeasurable |
| Linear expansion coefficient (ppm) | 50 | 25 | 25 | 30 | 65 | 60 |
| Tensile strength (MPa) | 110 | 85 | 80 | 90 | 15 | 20 |
| Elongation (%) | 15 | 9 | 8 | 9 | 0.5 | 1.2 |

In Tables 1 and 2, compounds marked with *1 to *7 are as follows:

[Chemical 42]
*1: Epoxy resin 1

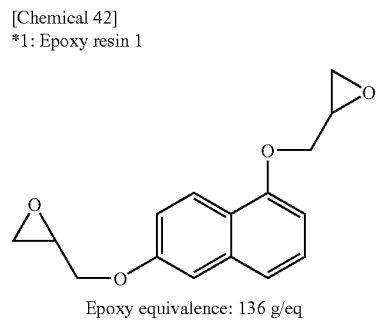

Epoxy equivalence: 136 g/eq

*2: N-methylpyrrolidone

[Chemical 43]
*3: Comparative polymer 1

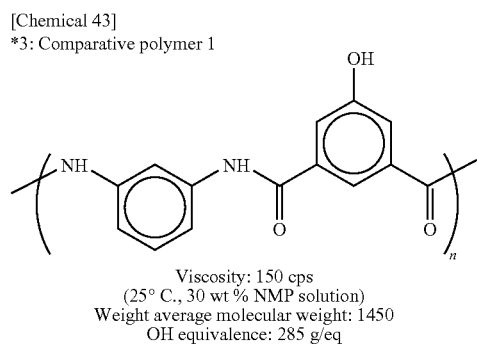

Viscosity: 150 cps
(25° C., 30 wt % NMP solution)
Weight average molecular weight: 1450
OH equivalence: 285 g/eq

[Chemical 44]
*4: Comparative polymer 2

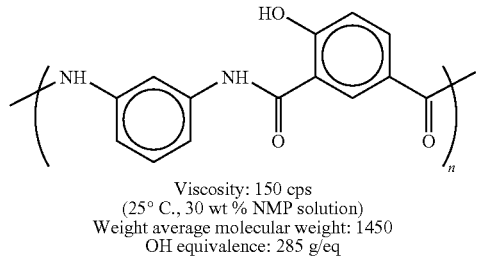

Viscosity: 150 cps
(25° C., 30 wt % NMP solution)
Weight average molecular weight: 1450
OH equivalence: 285 g/eq

[Chemical 45]
*5: Epoxy resin 2

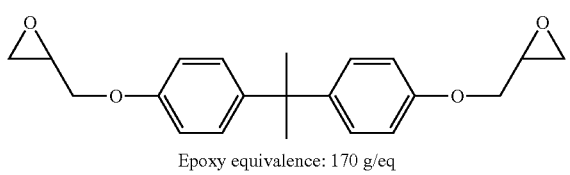

Epoxy equivalence: 170 g/eq

[Chemical 46]
*6: Epoxy resin 3

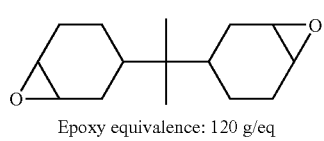

Epoxy equivalence: 120 g/eq

-continued

[Chemical 47]
*7: Epoxy resin 4

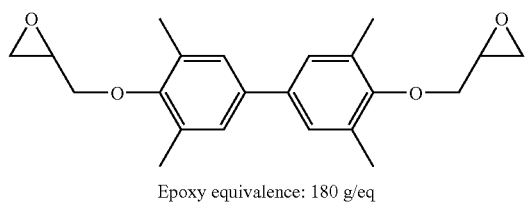

Epoxy equivalence: 180 g/eq

From the comparison between the results of Examples 1 to 10 and those of Comparative Examples 1 and 2, it is quite clear that in the case where a polyvalent epoxy compound was hardened with a polyamide compound having a phenolic hydroxyl group, the polyamide compound (Examples 1 to 10) that had a phenolic hydroxyl group at a specific position provided extremely excellent chemical resistance, tensile test properties, etc. as compared to the polyamide compound (Comparative Examples 1 and 2) that had a phenolic hydroxyl group at other position.

Examples 11 to 44 and Comparative Examples 3 to 12

Hardenable epoxy resin compositions with the mixing ratios shown in Tables 3 to 9 each were prepared, similarly to Examples 1 to 10, by using the example polymers obtained in the aforementioned Synthesis Examples or the comparative polymers described below. The mixing ratio is given in parts by weight. In Tables 3 to 9, parenthesized values with "Vol. %" in the column of spherical silica represents the volume fraction of the spherical silica contained in the hardenable epoxy resin composition. The hardened materials of the hardenable epoxy resin compositions were evaluated in terms of chemical resistance, glass transition temperature, linear expansion coefficient, tensile strength, elasticity, elongation, 360-degree bending property, and plating peel strength. The results are shown in Tables 3 to 9.

The chemical resistance was evaluated as follows: a cotton applicator was dipped in N-methylpyrrolidone and drawn up; after confirming that drip of N-methylpyrrolidone from the cotton applicator stopped, the surface of a hardened material of resin, over about 5 cm long, was rubbed with the cotton applicator; at every 10 times of rubbing, the cotton applicator was re-dipped in N-methylpyrrolidone; and the number of the rubbing time was counted until the hardened material started to dissolve. The dissolution of the hardened material was detected by visual observation.

The glass transition temperature was measured using the dynamic viscoelastic method.

The linear expansion coefficient was measured for a sample that was cut out into a strip 2 cm wide and 10 cm long.

The tensile strength and elongation were measured in accordance with JIS-K6911.

The elasticity was measured with a dynamic viscoelastic tester. The 360-degree bending property was measured in accordance with JIS K-5400.

The plating peel strength was measured in accordance with JIS-C6481.

TABLE 3

|  | Example 11 | Example 12 | Example 13 | Example 14 | Example 15 | Example 16 | Example 17 | Example 18 | Example 19 |
|---|---|---|---|---|---|---|---|---|---|
| Example polymer 11 | 10 g | 10 g | 10 g |  |  |  |  |  |  |
| Example polymer 12 |  |  |  | 10 g | 10 g | 10 g |  |  |  |
| Example polymer 13 |  |  |  |  |  |  | 10 g | 10 g | 10 g |
| Example polymer 14 |  |  |  |  |  |  |  |  |  |
| Epoxy resin 1*1 | 4.8 g | 4.8 g | 4.8 g | 9.9 g | 9.9 g | 9.9 g | 5.2 g | 5.2 g | 5.2 g |
| Epoxy resin 2*2 |  |  |  |  |  |  |  |  |  |
| Spherical silica*3 | 0 | 19.7 g (40 Vol. %) | 19.7 g (40 Vol. %) | 0 | 26.5 g (40 Vol. %) | 26.5 g (40 Vol. %) | 0 | 20.3 g (40 Vol. %) | 20.3 g (40 Vol. %) |
| Aluminum borate whisker*4 |  |  | 2.995 g |  |  | 3.975 g |  |  | 3.045 g |
| 2-Ethyl-4-methyl imidazole | 0.144 g | 0.144 g | 0.144 g | 0.297 g | 0.297 g | 0.297 g | 0.156 g | 0.156 g | 0.156 g |
| NMP*5 | 10 g | 10 g | 10 g | 10 g | 10 g | 10 g | 10 g | 10 g | 10 g |
| Chemical resistance | ≧100 times | ≧100 times | ≧100 times | ≧100 times | ≧100 times | ≧100 times | ≧100 times | ≧100 times | ≧100 times |
| Glass transition temperature | 230° C. | 235° C. | 237° C. | 260° C. | 264° C. | 267° C. | 230° C. | 235° C. | 240° C. |
| Liner expansion coefficient | 40 ppm | 25 ppm | 15 ppm | 35 ppm | 22 ppm | 14 ppm | 32 ppm | 23 ppm | 16 ppm |
| Tensile strength | 70 MPa | 105 MPa | 115 MPa | 95 MPa | 100 MPa | 111 MPa | 90 MPa | 95 MPa | 102 MPa |
| Elasticity | 3.5 GPa | 7.4 GPa | 8.4 GPa | 4.6 GPa | 8.6 GPa | 9.3 GPa | 4.6 GPa | 8.6 GPa | 9.2 GPa |
| Elongation | 12% | 6% | 5% | 11% | 5% | 5% | 12% | 6% | 5% |
| 360-degree bending property | Passed | Passed | Passed | Passed | Passed | Passed | Passed | Passed | Passed |
| Plating peel strength | 1.0 kg/cm | 0.9 kg/cm | 0.9 kg/cm | 1.2 kg/cm | 0.8 kg/cm | 0.7 kg/cm | 0.9 kg/cm | 0.7 kg/cm | 0.7 kg/cm |

TABLE 4

|  | Example 20 | Example 21 | Example 22 | Example 23 | Example 24 | Example 25 |
| --- | --- | --- | --- | --- | --- | --- |
| Example polymer 11 |  |  |  |  |  |  |
| Example polymer 12 |  |  |  |  |  |  |
| Example polymer 13 |  |  |  |  |  |  |
| Example polymer 14 | 10 g | 10 g | 10 g |  |  |  |
| Example polymer 15 |  |  |  | 10 g | 10 g | 10 g |
| Epoxy resin 1*[1] | 7.2 g | 7.2 g | 7.2 g | 5.3 g | 5.3 g | 5.3 g |
| Epoxy resin 2*[2] |  |  |  |  |  |  |
| Spherical silica*[3] | 0 | 22.9 g (40 Vol. %) | 22.9 g (40 Vol. %) | 0 | 20.4 g | 20.4 g |
| Aluminum borate whisker*[4] |  |  | 3.435 g |  |  | 3.06 g |
| 2-Ethyl-4-methyl imidazole | 0.215 g | 0.215 g | 0.215 g | 0.18 g | 0.339 g | 0.195 g |
| NMP*[5] | 10 g | 10 g | 10 g | 10 g | 10 g | 10 g |
| Chemical resistance | ≧100 times | ≧100 times | ≧100 times | ≧100 times | ≧100 times | ≧100 times |
| Glass transition temperature | 240° C. | 245° C. | 246° C. | 210° C. | 230° C. | 200° C. |
| Liner expansion coefficient | 28 ppm | 19 ppm | 14 ppm | 18 ppm | 13 ppm | 10 ppm |
| Tensile strength | 90 MPa | 100 MPa | 111 MPa | 80 MPa | 90 MPa | 98 MPa |
| Elasticity | 4.4 GPa | 9.4 GPa | 9.9 GPa | 3.1 GPa | 7.4 GPa | 8.5 GPa |
| Elongation | 10% | 4% | 4% | 15% | 9% | 7% |
| 360-degree bending property | Passed | Passed | Passed | Passed | Passed | Passed |
| Plating peel strength | 0.8 kg/cm | 0.6 kg/cm | 0.6 kg/cm | 0.8 kg/cm | 0.9 kg/cm | 0.8 kg/cm |

TABLE 5

|  | Example 26 | Example 27 | Example 28 | Example 29 |
| --- | --- | --- | --- | --- |
| Example polymer 11 | 10 g |  |  |  |
| Example polymer 12 |  | 10 g |  |  |
| Example polymer 13 |  |  | 10 g |  |
| Example polymer 14 |  |  |  | 10 g |
| Epoxy resin 1*[1] |  |  |  |  |
| Epoxy resin 2*[2] | 6.0 g | 11.3 g | 6.5 g | 8.9 g |
| Spherical silica*[3] | 21.3 g | 28.4 g | 22.0 g | 25.2 g |
| Aluminum borate whisker*[4] | 3.2 g | 4.26 g | 3.3 g | 3.78 g |
| 2-Ethyl-4-methyl imidazole | 0.18 g | 0.339 g | 0.195 g | 0.267 g |
| NMP*[5] | 10 g | 10 g | 10 g | 10 g |
| Chemical resistance | ≧100 times | ≧100 times | ≧100 times | ≧100 times |
| Glass transition temperature | 210° C. | 230° C. | 200° C. | 215° C. |
| Liner expansion coefficient | 25 ppm | 22 ppm | 21 ppm | 21 ppm |

TABLE 5-continued

|  | Example 26 | Example 27 | Example 28 | Example 29 |
|---|---|---|---|---|
| Tensile strength | 105 MPa | 100 MPa | 115 MPa | 97 MPa |
| Elasticity | 8.5 GPa | 9.6 GPa | 8.7 GPa | 7.5 GPa |
| Elongation | 5% | 6% | 6% | 5% |
| 360-degree bending property | Passed | Passed | Passed | Passed |
| Plating peel strength | 0.6 kg/cm | 0.4 kg/cm | 0.5 kg/cm | 0.8 kg/cm |

TABLE 6

|  | Example 30 | Example 31 | Example 32 | Example 33 | Example 34 | Example 35 | Example 36 | Example 37 | Example 38 |
|---|---|---|---|---|---|---|---|---|---|
| Example polymer 15 |  |  |  |  |  |  | 10 g |  |  |
| Example polymer 16 | 10 g | 10 g | 10 g |  |  |  |  | 10 g |  |
| Example polymer 17 |  |  |  | 10 g | 10 g | 10 g |  |  | 10 g |
| Epoxy resin 1*[1] | 2.01 g | 2.01 g | 2.01 g | 1.93 g | 1.93 g | 1.93 g |  |  |  |
| Epoxy resin 2*[2] |  |  |  |  |  |  | 6.7 g | 2.5 g | 2.41 g |
| Spherical silica*[3] | 0 | 16.09 g (40 Vol. %) | 16.09 g (40 Vol. %) | 0 | 15.99 g (40 Vol. %) | 15.99 g (40 Vol. %) | 22.5 g | 16.76 g | 16.64 g |
| Aluminum borate whisker*[4] |  |  | 2.54 g |  |  | 2.4 g | 3.38 g | 2.51 g | 2.5 g |
| 2-Ethyl-4-methyl imidazole | 0.06 g | 0.06 g | 0.06 g | 0.06 g | 0.06 g | 0.06 g | 0.201 g | 0.075 g | 0.072 g |
| NMP*[5] | 10 g | 10 g | 10 g | 10 g | 10 g | 10 g | 10 g | 10 g | 10 g |
| Chemical resistance | ≧100 times | ≧100 times | ≧100 times | ≧100 times | ≧100 times | ≧100 times | ≧100 times | ≧100 times | ≧100 times |
| Glass transition temperature | 190° C. | 200° C. | 205° C. | 200° C. | 210° C. | 190° C. | 190° C. | 194° C. | 200° C. |
| Liner expansion coefficient | 22 ppm | 16 ppm | 14 ppm | 20 ppm | 16 ppm | 14 ppm | 24 ppm | 22 ppm | 22 ppm |
| Tensile strength | 90 MPa | 95 MPa | 100 MPa | 80 MPa | 90 MPa | 98 MPa | 100 MPa | 116 MPa | 95 MPa |
| Elasticity | 4.4 GPa | 9.3 GPa | 9.8 GPa | 3.0 GPa | 7.1 GPa | 9.0 GPa | 9.9 GPa | 8.9 GPa | 7.8 GPa |
| Elongation | 9% | 4% | 4% | 9% | 5% | 5% | 5% | 5% | 4% |
| 360-degree bending property | Passed | Passed | Passed | Passed | Passed | Passed | Passed | Passed | Passed |
| Plating peel strength | 0.8 kg/cm | 0.6 kg/cm | 0.6 kg/cm | 0.8 kg/cm | 0.5 kg/cm | 0.5 kg/cm | 0.4 kg/cm | 0.4 kg/cm | 0.6 kg/cm |

TABLE 7

|  | Example 39 | Example 40 | Example 41 | Example 42 | Example 43 | Example 44 |
|---|---|---|---|---|---|---|
| Example polmer 11 | 8 g | 8 g | 8 g | 8 g | 8 g | 8 g |
| Epoxy resin 1*[1] | 6.39 g | 6.39 g | 6.39 g | 5.34 g | 5.34 g | 5.34 g |
| Phenol-novolak resin 1*[8] | 2 g | 2 g | 2 g |  |  |  |
| Phenol-novolak resin 2*[9] |  |  |  | 2 g | 2 g | 2 g |
| Spherical silica*[3] | 0 | 26.7 g (40 Vol. %) | 26.7 g | 0 | 25.0 g (40 Vol. %) | 25.0 g |
| Aluminum borate whisker*[4] |  |  | 2.995 g |  |  | 2.995 g |
| 2-Ethyl-4-methyl imidazole | 0.192 g | 0.192 g | 0.192 g | 0.16 g | 0.16 g | 0.16 g |

TABLE 7-continued

|  | Example 39 | Example 40 | Example 41 | Example 42 | Example 43 | Example 44 |
|---|---|---|---|---|---|---|
| NMP*5 | 10 g | 10 g | 10 g | 10 g | 10 g | 10 g |
| Chemical resistance | ≧100 times | ≧100 times | ≧100 times | ≧100 times | ≧100 times | ≧100 times |
| Glass transition temperature | 230° C. | 235° C. | 237° C. | 260° C. | 264° C. | 267° C. |
| Liner expansion coefficient | 42 ppm | 26 ppm | 16 ppm | 37 ppm | 25 ppm | 15 ppm |
| Tensile strength | 60 MPa | 92 MPa | 103 MPa | 90 MPa | 98 MPa | 100 MPa |
| Elasticity | 3.4 GPa | 7.2 GPa | 8.1 GPa | 4.2 GPa | 8.1 GPa | 9.0 GPa |
| Elongation | 11% | 4% | 4% | 7% | 4% | 5% |
| 360-degree bending property | Passed | Passed | Passed | Passed | Passed | Passed |
| Plating peel strength | 1.2 kg/cm | 1.1 kg/cm | 1.0 kg/cm | 1.3 kg/cm | 1.2 kg/cm | 0.9 kg/cm |

TABLE 8

|  | Comparative Example 3 | Comparative Example 4 | Comparative Example 5 | Comparative Example 6 | Comparative Example 7 | Comparative Example 8 |
|---|---|---|---|---|---|---|
| Comparative polymer 1*6 | 10 g | 10 g |  |  | 10 g |  |
| Comparative polymer 2*7 |  |  | 10 g | 10 g |  | 10 g |
| Epoxy resin 1*1 | 4.8 g | 4.8 g | 4.8 g | 4.8 g |  |  |
| Epoxy resin 2*2 |  |  |  |  | 6.0 g | 6.0 g |
| Spherical silica*3 | 0 | 19.7 g (40 Vol. %) | 0 | 19.7 g (40 Vol. %) | 0 | 0 |
| 2-Ethyl-4-methyl imidazole | 0.143 g | 0.143 g | 0.143 g | 0.143 g | 0.18 g | 0.18 g |
| NMP*5 | 10 g | 10 g | 10 g | 10 g | 10 g | 10 g |
| Chemical resistance | 50 times | 20 times | 50 times | 10 times | ≧100 times | ≧100 times |
| Glass transition temperature | Unmeasurable | Unmeasurable | Unmeasurable | Unmeasurable | 160° C. | 170° C. |
| Liner expansion coefficient | 60 ppm | 39 ppm | 65 ppm | 40 ppm | 65 ppm | 60 ppm |
| Tensile strength | 20 MPa | 30 MPa | 18 MPa | Unmeasurable | 18 MPa | 25 MPa |
| Elasticity | 2.5 GPa | 8.0 GPa | 2.7 GPa | 7.8 GPa | 2.7 GPa | 3.0 GPa |
| Elongation | 1.2% | 0.5% | 0.5% | Unmeasurable | 1.2% | 1.0% |
| 360-degree bending property | Cracking | Cracking | Cracking | Cracking | Cracking | Cracking |
| Plating peel strength | 0.1 kg/cm | Plating impossible | 0.1 kg/cm | Plating impossible | 0.1 kg/cm | 0.1 kg/cm |

TABLE 9

|  | Comparative Example 9 | Comparative Example 10 | Comparative Example 11 | Comparative Example 12 |
|---|---|---|---|---|
| Comparative polymer 1*6 | 8 g | 8 g | 8 g | 8 g |
| Comparative polymer 2*7 |  |  |  |  |
| Epoxy resin 1*1 | 6.39 g | 6.39 g | 5.34 g | 5.34 g |
| Epoxy resin 2*2 |  |  |  |  |
| Phenol-novolak resin 1*8 | 2 g | 2 g |  |  |
| Phenol-novolak resin 2*9 |  |  | 2 g | 2 g |
| Spherical silica*3 | 0 | 26.7 g (40 Vol. %) | 0 | 25 g (40 Vol. %) |

TABLE 9-continued

|  | Comparative Example 9 | Comparative Example 10 | Comparative Example 11 | Comparative Example 12 |
|---|---|---|---|---|
| 2-Ethyl-4-methyl imidazole | 0.192 g | 0.192 g | 0.16 g | 0.16 g |
| NMP*5 | 10 g | 10 g | 10 g | 10 g |
| Chemical resistance | ≧100 times | 50 times | ≧100 times | 50 times |
| Glass transition temperature | 150° C. | 152° C. | 145° C. | 151° C. |
| Liner expansion coefficient | 62 ppm | 34 ppm | 64 ppm | 41 ppm |
| Tensile strength | 20 MPa | 30 MPa | 18 MPa | Unmeasurable |
| Elasticity | 2.6 GPa | 8.1 GPa | 2.6 GPa | 7.7 GPa |
| Elongation | 1.4% | 0.5% | 1% | Unmeasurable |
| 360-degree bending property | Cracking | Cracking | Cracking | Cracking |
| Plating peel strength | 0.1 kg/cm | Plating impossible | 0.1 kg/cm | Plating impossible |

In Tables 3 to 9, compounds marked with *1 to *9 are as follows:

[Chemical 48]
*1: Epoxy resin 1

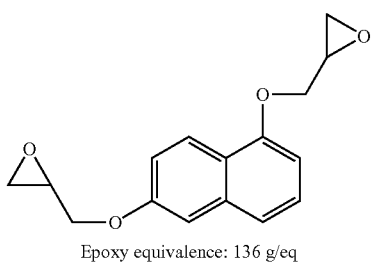

Epoxy equivalence: 136 g/eq

[Chemical 49]
*2: Epoxy resin 2

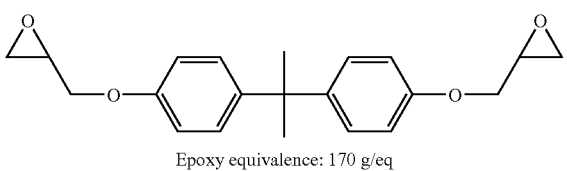

Epoxy equivalence: 170 g/eq

*3: Spherical silica: an average particle diameter of from 0.1 μm to 20 μm
*4: Aluminum borate whisker: a short axis of 0.3 μm, a long axis of 3 μm, and an aspect ration of 10
*5: N-methylpyrrolidone

[Chemical 50]
*6: Comparative polymer 1

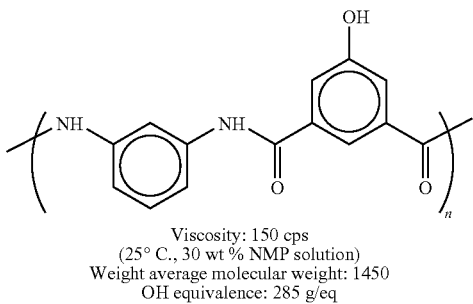

Viscosity: 150 cps
(25° C., 30 wt % NMP solution)
Weight average molecular weight: 1450
OH equivalence: 285 g/eq

[Chemical 51]
*7: Comparative polymer 2

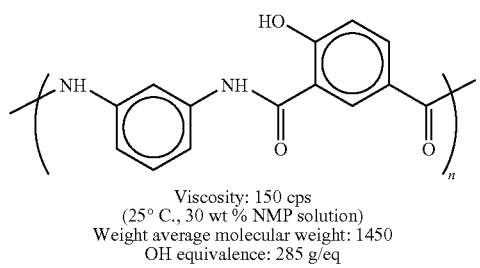

Viscosity: 150 cps
(25° C., 30 wt % NMP solution)
Weight average molecular weight: 1450
OH equivalence: 285 g/eq

[Chemical 52]
*8: Phenolnovolak resin 1

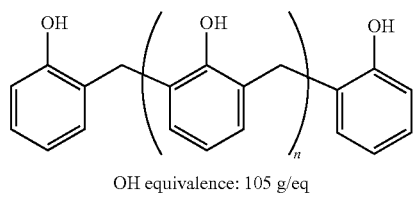

OH equivalence: 105 g/eq

[Chemical 53]
*9: Phenolnovolak resin 2

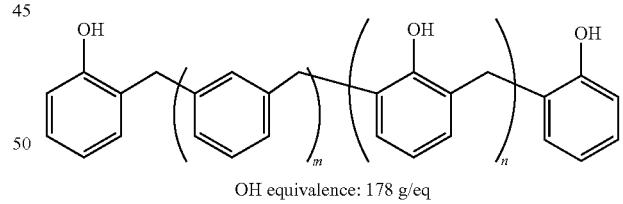

OH equivalence: 178 g/eq

INDUSTRIAL APPLICABILITY

According to the present invention, a hardenable epoxy resin composition that provides a hardened material having high glass transition temperature, low linear expansion coefficient, and excellent properties including tensile strength, elongation, and flexibility can be provided.

The invention claimed is:
1. A hardenable epoxy resin composition comprising a polyamide compound having as a repeating unit thereof a moiety that has a phenolic hydroxyl group and is represented by the following general formula (I) or (II):

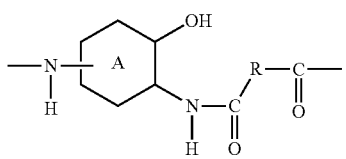
(I)

in the general formula (I), ring-A represents a phenylene group, wherein the phenylene group may be substituted by a halogen atom, a hydroxyl group, or a $C_{1-4}$ alkyl group; R represents a $C_{2-10}$ alkylene group, a $C_{6-18}$ cycloalkylene group, an arylene group, or a $C_{13-25}$ alkylidene diarylene group, wherein these R groups may be substituted by a halogen atom or a $C_{1-4}$ alkyl group; and part of the phenolic hydroxyl groups in the repeating units may undergo cyclodehydration with an amide group adjacent to each phenolic hydroxyl group; and

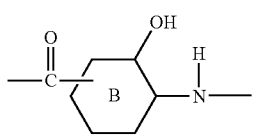
(II)

in the general formula (II), ring-B represents a $C_{6-18}$ arylene group or a $C_{13-25}$ alkylidene diarylene group, wherein these groups may be substituted by a halogen atom, a hydroxyl group, or a $C_{1-4}$ alkyl group.

2. The hardenable epoxy resin composition according to claim 1, wherein R in the general formula (I) or (III) is a phenylene group or a naphthylene group.

3. The hardenable epoxy resin composition according to claim 1, wherein the polyamide compound is a hardener for the epoxy resin composition.

4. The hardenable epoxy resin composition according to claim 1, further comprising a phenolnovolak resin.

5. The hardenable epoxy resin composition according to claim 1, further comprising a filler.

6. The hardenable epoxy resin composition according to claim 5, wherein the filler is spherical silica having an average particle diameter of from 0.1 pm to 20 pm.

7. The hardenable epoxy resin composition according to claim 1, wherein the polyamide compound has a chemical structure that has a phenolic hydroxyl group and is represented by the following general formula (III) or (IV):

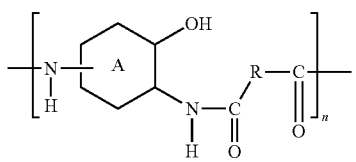
(III)

in the general formula (III), ring-A represents a phenylene group, wherein the phenylene group may be substituted by a halogen atom, a hydroxyl group, or a $C_{1-4}$ alkyl group; and R represents a $C_{2-10}$ alkylene group, a $C_{6-18}$ cycloalkylene group, an arylene group, or a $C_{13-25}$ alkylidene diarylene group, wherein these R groups may be substituted by a halogen atom or a $C_{1-4}$ alkyl group; and n is a positive number, and

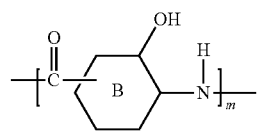
(IV)

in the general formula (IV), ring-B represents a $C_{6-18}$ arylene group or a $C_{13-25}$ alkylidene diarylene group, wherein these groups may be substituted by a halogen atom, a hydroxyl group, or a $C_{1-4}$ alkyl group; and m is a positive number.

8. The hardenable epoxy resin composition according to claim 7, wherein the ring-A in the general formula (I) or (III) is a phenylene group or a naphthylene group.

9. The hardenable epoxy resin composition according to claim 7, wherein R in the general formula (I) or (III) is a phenylene group or a naphthylene group.

10. The hardenable epoxy resin composition according to claim 7, wherein the polyamide compound is a hardener for the epoxy resin composition.

11. The hardenable epoxy resin composition according to claim 7, further comprising a filler.

12. The hardenable epoxy resin composition according to claim 7, further comprising a phenolnovolak resin.

13. A hardenable epoxy resin composition comprising a phosphorous-based flame retardant admixed with the hardenable epoxy resin composition according claim 1 in an amount of from 5 to 100 parts by mass based on 100 parts by mass of the total amount of epoxy resin and hardener.

14. The hardenable epoxy resin composition according to claim 13, wherein the phosphorous-based flame retardant is a phosphoric acid amide compound represented by the following general formula (V):

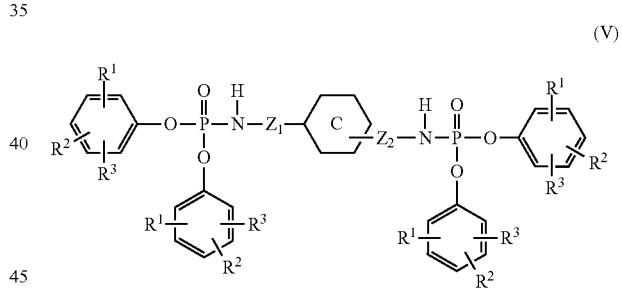
(V)

in the general formula (V), R1, R2 and R3 each represents a hydrogen atom, a $C_{1-8}$ alkyl, a cycloalkyl group, or a halogen atom; $Z_1$ and $Z_2$ each represents a direct bonding, a $C_1$-$_4$ alkylene group, or a alkylidene group; and ring-C represents a $C_{6-18}$ arylene group, a cycloalkylene group, or an arylenealkylene(alkylidene)-arylene group.

15. A hardened material of the hardenable epoxy resin composition according to claim 1.

16. An epoxy resin laminated sheet comprising the hardenable epoxy resin composition according to claim 1.

17. A hardenable epoxy resin composition comprising a phosphorous-based flame retardant admixed with the hardenable epoxy resin composition according to claim 7 in an amount of from 5 to 100 parts by mass based on 100 parts by mass of the total amount of epoxy resin and hardener.

18. A hardened material of the hardenable epoxy resin composition according to claim 7.

19. An epoxy resin laminated sheet comprising the hardenable epoxy resin composition according to claim 7.

* * * * *

UNITED STATES PATENT AND TRADEMARK OFFICE
CERTIFICATE OF CORRECTION

PATENT NO. : 8,426,504 B2
APPLICATION NO. : 11/916105
DATED : April 23, 2013
INVENTOR(S) : Mori et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 608 days.

Signed and Sealed this
Eighth Day of September, 2015

Michelle K. Lee
*Director of the United States Patent and Trademark Office*